United States Patent
Achiriloaie

[19]

[11] Patent Number: 6,094,350
[45] Date of Patent: *Jul. 25, 2000

[54] FEEDFORWARD AMPLIFIER MANUFACTURING MODULE

[75] Inventor: Benone Achiriloaie, Camarillo, Calif.

[73] Assignee: AML Communications, Inc., Camarillo, Calif.

[*] Notice: This patent is subject to a terminal disclaimer.

[21] Appl. No.: 09/326,426

[22] Filed: Jun. 4, 1999

Related U.S. Application Data

[63] Continuation of application No. 09/083,579, May 21, 1998, Pat. No. 5,977,826

[60] Provisional application No. 60/077,839, Mar. 13, 1998.

[51] Int. Cl.[7] .................................................. H05K 1/14

[52] U.S. Cl. ...................... 361/737; 361/704; 361/709; 361/712; 361/713; 361/715; 361/719; 361/720; 361/818; 361/829; 361/831; 174/35 R; 174/35 OC; 174/51; 174/16.3; 165/80.2; 165/80.3; 165/104.33

[58] Field of Search ..................................... 361/704, 709, 361/712, 713, 715, 719, 720, 818, 829, 831; 174/16.1, 16.3, 51, 252, 35 R, 35 GC; 165/80.2, 80.3, 104.33

[56] References Cited

U.S. PATENT DOCUMENTS

| | | | |
|---|---|---|---|
| 4,658,334 | 4/1987 | McSparran et al. | 361/415 |
| 5,107,404 | 4/1992 | Tam | 361/424 |
| 5,250,845 | 10/1993 | Runyan | 257/729 |
| 5,566,055 | 10/1996 | Salvi, Jr. | 361/816 |
| 5,977,826 | 11/1999 | Behan et al. | 330/151 |

*Primary Examiner*—Leo P. Picard
*Assistant Examiner*—Tuan Dinh
*Attorney, Agent, or Firm*—Gene W. Arant; Larry D. Baker

[57] ABSTRACT

A manufacturing module for an RF feed-forward amplifier subsystem that allows for simple and cost-effective assembly, yet provides separate compartments for the different stages of the subsystem, with low RF leakage between the compartments is disclosed. The manufacturing module comprises a printed circuit board having one or more circuit trace layers, and ground planes covering a substantial portion of the top and bottom surfaces. The printed circuited board also has numerous plated-through holes electrically connecting the top and bottom ground planes. The circuit board is sandwiched between a heatsink having a flat upper surface and a machined enclosure having an outer wall and inner divider walls. The plated-through holes, space less than 1/10 wavelength of module's highest carrier frequency apart, serve to electrically connect the heatsink to the machined enclosure, thus creating separate compartments with low RF leakage.

7 Claims, 4 Drawing Sheets

Fig. 3(a)

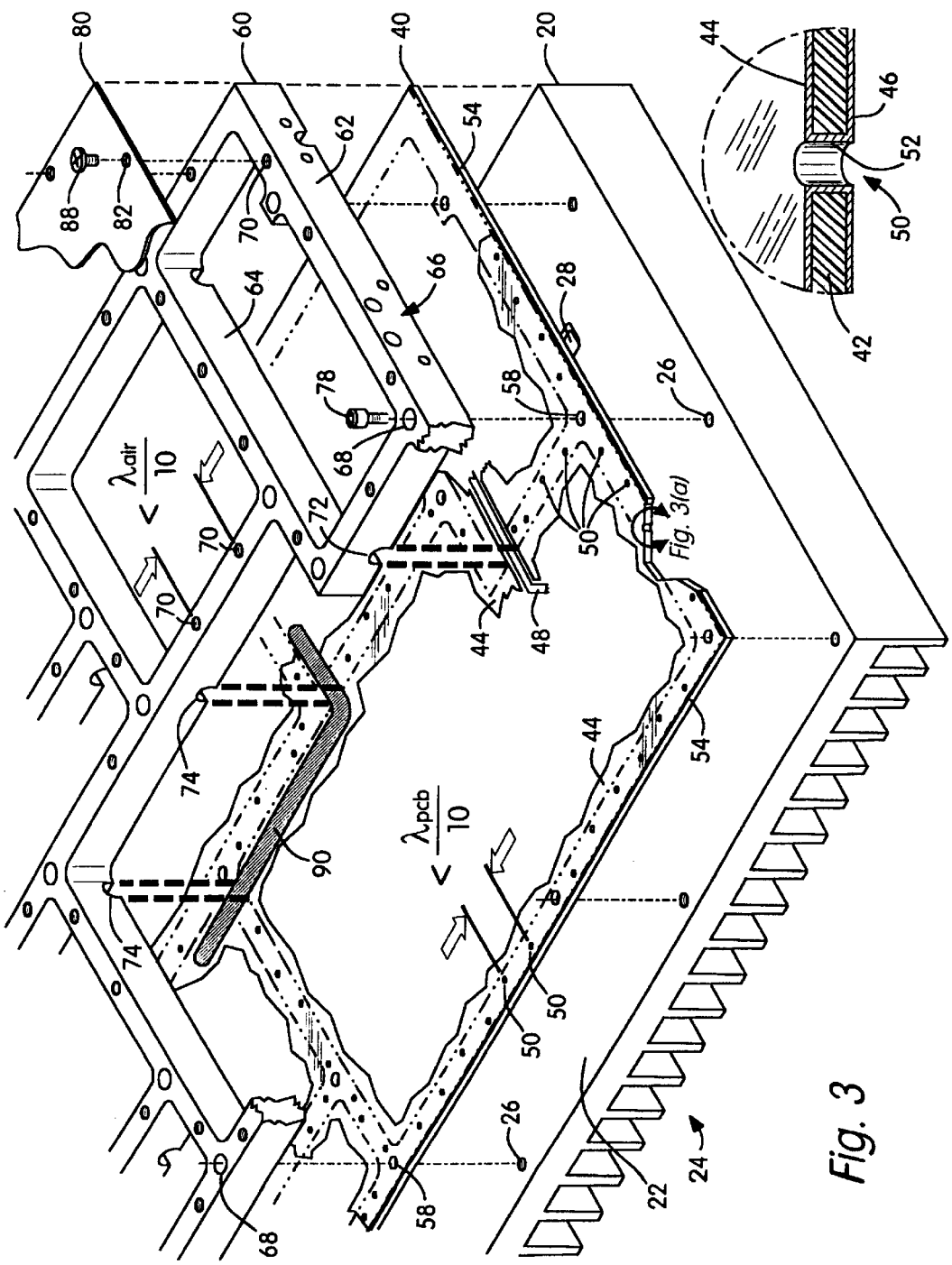

FEEDFORWARD AMPLIFIER MANUFACTURING MODULE

RELATED APPLICATION

This application claims the benefit of U.S. patent application Ser. No. 09/083,579 filed May 21, 1998, now issued U.S. Pat. No. 5,977,826, which claimed priority of U.S. Provisional application Ser. No. 60/077,839 filed on Mar. 13, 1998.

FIELD OF THE INVENTION

This invention relates to the mechanical packaging of electronic equipment, and more particularly to the packaging of RF assemblies requiring multiple interconnected stages or subsystems with low RF leakage between the stages.

BACKGROUND OF THE INVENTION

The economical packaging of RF systems and modules is complicated by the need to prevent leakage of RF signals from one part of the system to another, or from the system to the outside environment. The problem is compounded by the need for systems to be easily assembled and maintained. It is a particular problem with amplifier modules, in which high-amplitude signals, low-amplitude signals, and high-gain circuit components must be packaged together in a small volume.

To achieve low RF leakage between parts of a subsystem, an RF subsystem is typically partitioned into a number of separate physical compartments. Interconnection of the compartments often requires additional manufacturing steps including hand assembly, which significantly increases costs. The separate physical compartments may also complicate testing and adjustment of the subsystem.

A feed-forward amplifier module, such as that of the present invention, presents a particularly difficult packaging problem, since within a small volume several separate amplifiers having high gains must be packaged.

Error correction of amplifiers grows ever more important as frequency allocation, frequency reuse, and RF interference (RFI) become more prevalent. In the amplification of electronic message signals one paramount consideration is to maintain signal fidelity, while another paramount consideration is to minimize the operating power requirements. Those two factors are in conflict with each other. High efficiency amplifiers will typically have high signal distortion, but high-fidelity amplifiers typically require high operating power.

One approach to obtaining both high efficiency and low distortion is the use of cascaded feed-forward amplifiers as discussed in copending application Ser. No. 09/083,579. The feed forward amplifier system utilizes a main amplifier having a high power efficiency, and which is permitted to operate with high signal distortion. Associated circuits then observe and measure the distortion or error, and produce a correction signal which is added into the final output of the amplifier system so as to offset or counteract the signal distortion. A comparison is made between input and output signals of the main amplifier in order to provide an error signal, and a separate error amplifier is utilized to amplify the error signal before its re-insertion with appropriate polarity into the main amplifier path.

Feed forward amplifier systems typically have poor power efficiency, however. The efficiency can be greatly improved by making the error amplifier itself a feed-forward amplifier. While improving system efficiency, this comes at the cost of a much more complex error amplifier, making efficient and effective packaging of the error amplifier critical if the system is to be commercially competitive.

SUMMARY OF THE PRESENT INVENTION

The present invention comprises a manufacturing module for an RF feed-forward amplifier subsystem that allows for simple and cost-effective assembly, yet provides separate compartments for the different stages of the subsystem, with low RF leakage between the compartments.

In accordance with the present invention, the manufacturing module comprises a printed circuit board having one or more circuit trace layers, and ground planes covering a substantial portion of the top and bottom surfaces. The printed circuited board also has numerous plated-through holes electrically connecting the top and bottom ground planes. The circuit board is sandwiched between a heatsink having a flat upper surface and a machined enclosure having an outer wall and inner divider walls. The plated-through holes, spaced a small fraction of a wavelength of module's highest carrier frequency apart, serve to electrically connect the heatsink to the machined enclosure, thus creating separate compartments with low RF leakage.

The machined enclosure further serves to strengthen the circuit board, reducing the number of screws required to insure adequate thermal contact with the heatsink.

It is a further object of the invention to mount all the amplifier stages of the error amplifier module on a common circuit board which is in good thermal contact with a single common heatsink, allowing a single temperature sensor element may be used to provide temperature compensation control for both loops of the feed-forward amplifier, thus significantly reducing system complexity.

DRAWING SUMMARY

FIG. 3 is an exploded isometric view of a portion of the module, illustrating how the machined enclosure, circuit board, heatsink, and cover are assembled to form separate interior compartments with low RF leakage between the compartments.

Figure 4A:
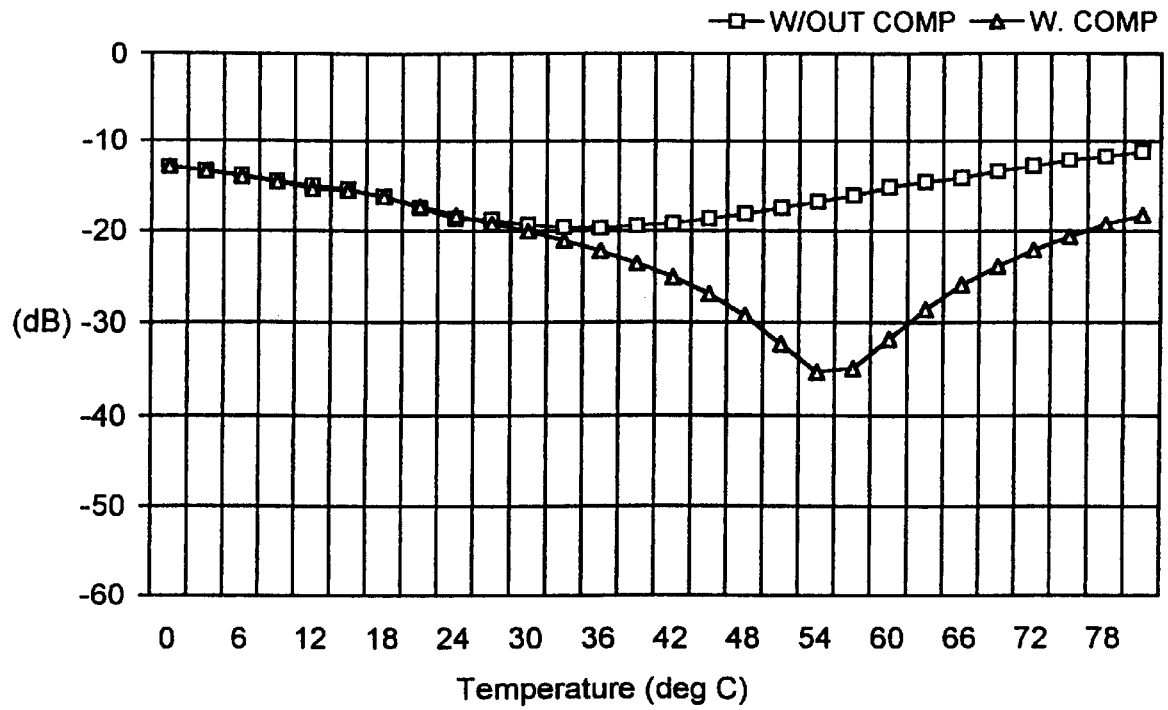
Figure 4B:
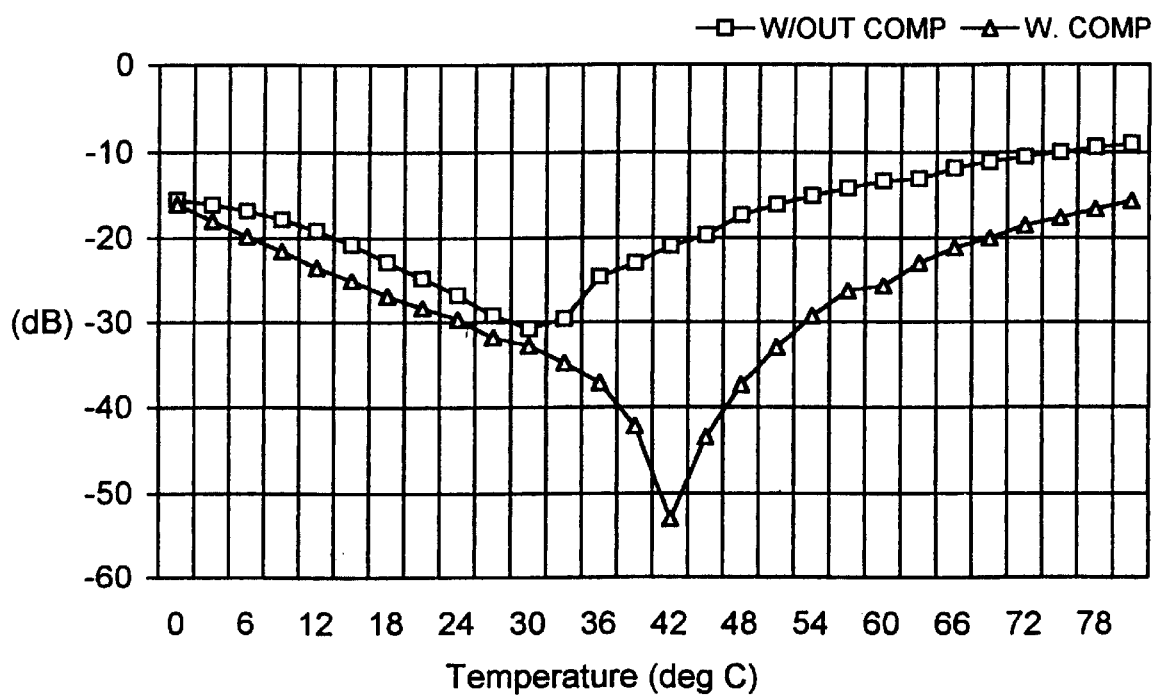

FIGS. 4(a) and 4(b) are data plots of the first and second loop cancellation versus temperature, illustrating how a single temperature sensor is utilized to compensate both loops of the feed-forward amplifier module.

CONCEPT OF THE INVENTION (FIG. 1)

Figure 1:
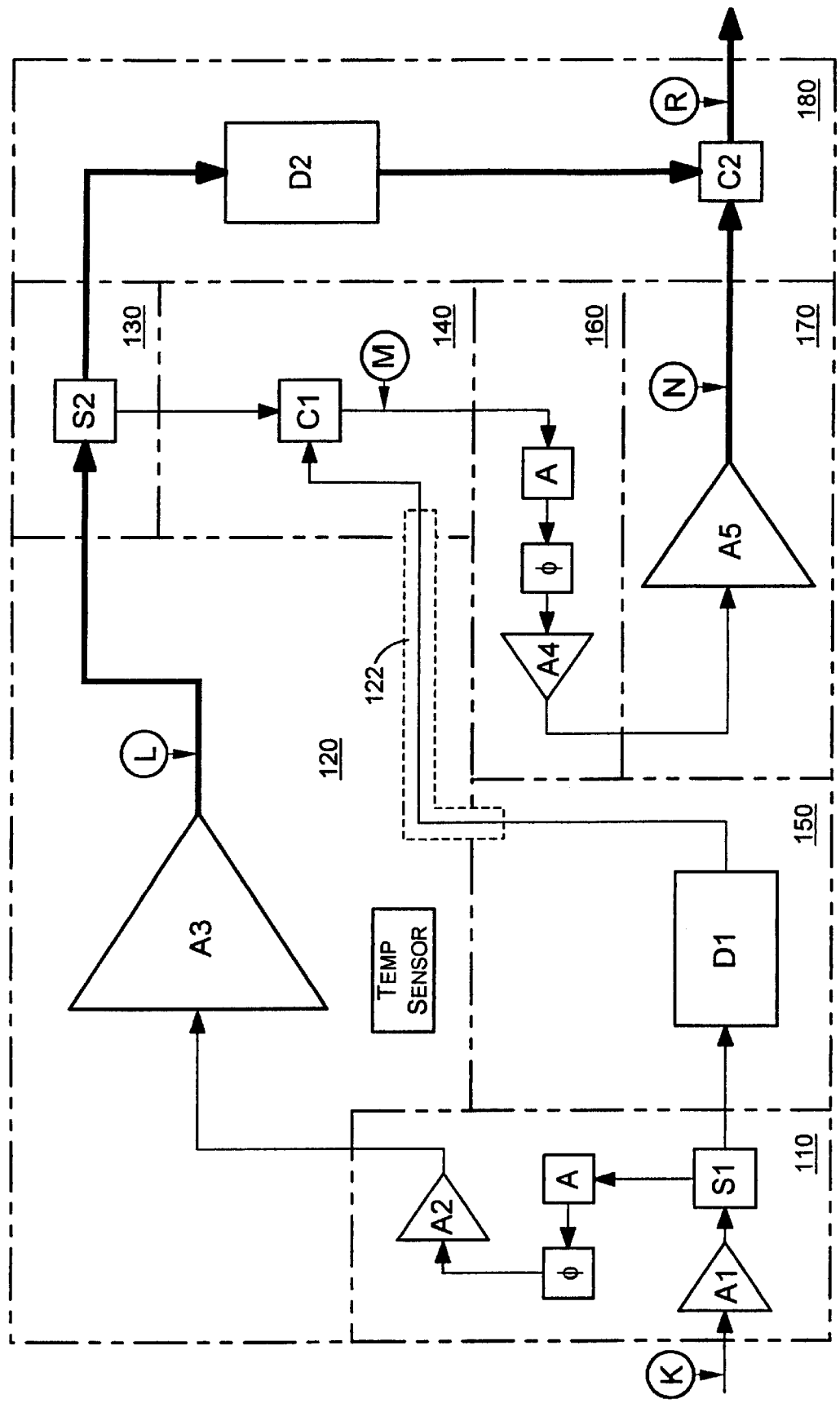
FIG. 1 is a conceptual block diagram of a feed forward amplifier system in accordance with the presently preferred form of the invention, and which identifies signals present at various points in the system.

FIG. 1 is an electrical block diagram of the module of the present invention, indicating how the subsystem is divided into separate compartments. The subsystem includes both low signal level stages and power stages of several watts; low RF leakage between the compartments is thus critical to prevent the high power signals from being coupled into the low signal level stages.

The module of the present invention provides the mechanical packaging for a feed-forward amplifier, which may itself be used as an error amplifier in a larger feed-forward amplifier system, as disclosed in applicant's copending U.S. patent application Ser. No. 09/083,579. The module thus includes a "main" power amplifier, A3, which is operated at a level that produces significant distortion products, and an "error" amplifier, A5, which amplifies the distortion products which are then subtractively combined with the main amplifier output.

As seen in FIG. 1, input signal K is applied to input amplifier A1 in compartment 110, which contains the main amplifier driver stage. The signal is then split by splitter S1, with part of the signal being applied to the first loop delay line D1 in compartment 150, and part of the signal passing though gain and phase compensation components A and Φ before being amplified by driver A2.

The signal output from driver A2 passes into compartment 120, the main amplifier final stage. Main amplifier A3 comprises a monolithic amplifier block and a discrete transistor power stage. Also in compartment 120 is a temperature sensor used to control the gain and phase compensation components of both the main amplifier driver stage and the error amplifier driver stage; the output of the temperature sensor is electrically connected (not shown) to the gain and phase circuits in both compartments 110 and 160.

The amplified main signal L passes from compartment 120 into compartment 130, where 30 dB coupler S2 splits the signal into a main output signal, which is applied to the second loop delay line D2 in compartment 180, and a lower level sample which is applied to the first loop cancellation combiner C1 in compartment 140. The first loop cancellation combiner subtractively combines the delayed signal from the first loop delay line D1 with sample from coupler S2, producing a signal primarily comprising the error components generated by amplifier A3. Since compartment 150 does not share a compartment boundary with compartment 140, the signal from delay line D1 is routed through a section of semi-rigid RF cable, 122, which is attached to the printed circuit board and passes through compartment 120.

Error signal M from the first cancellation combiner C1 is routed to compartment 160, which contains the error amplifier driver stage. Prior to amplification, the signal is routed through gain and phase compensation circuits. The gain and phase compensation components in both compartments 110 and 160 are needed to correct for temperature drift effects of amplifiers A2, A3, A4 and A5; changes in signal gain or phase would cause incomplete cancellation of signals in combiners C1 and C2. Since the main power amplifier A3 and the error amplifier A5 have substantially similar temperature drift characteristics and are mounted on a common heatsink, the single temperature sensor in compartment 120 may be used to generate control signals for both sets of compensation circuits.

From amplifier A4 the signal is routed to compartment 170, the error amplifier final stage. Amplifier A5 comprises a monolithic power block which amplifies the error components to a signal level matching the errors in the main amplified signal. The amplified error signal N is routed to compartment 180, which includes the second loop delay line D2 and second loop cancellation combiner C2. The final amplified output signal, R, with the error products introduced by amplifier A3 substantially cancelled, exits the module to be utilized in an RF system.

Main amplifier A3 is shown larger than the other amplifiers because it has a higher operating power level. Heavy lines in FIG. 1 indicate amplified signals, while dotted lines indicate that a signal sample is being taken for purpose of comparison.

The widely varying signal levels within the module, such as the low signal level inputs of the driver amplifier stages and the high level outputs of the final amplifier stages, make it critical that electromagnetic interference between circuit compartments be well-controlled. The present invention achieves this objective by forming an electromagnetic "cage" around each separate compartment, as will be fully explained below.

PHYSICAL IMPLEMENTATION

(FIG. 2)

Figure 2:
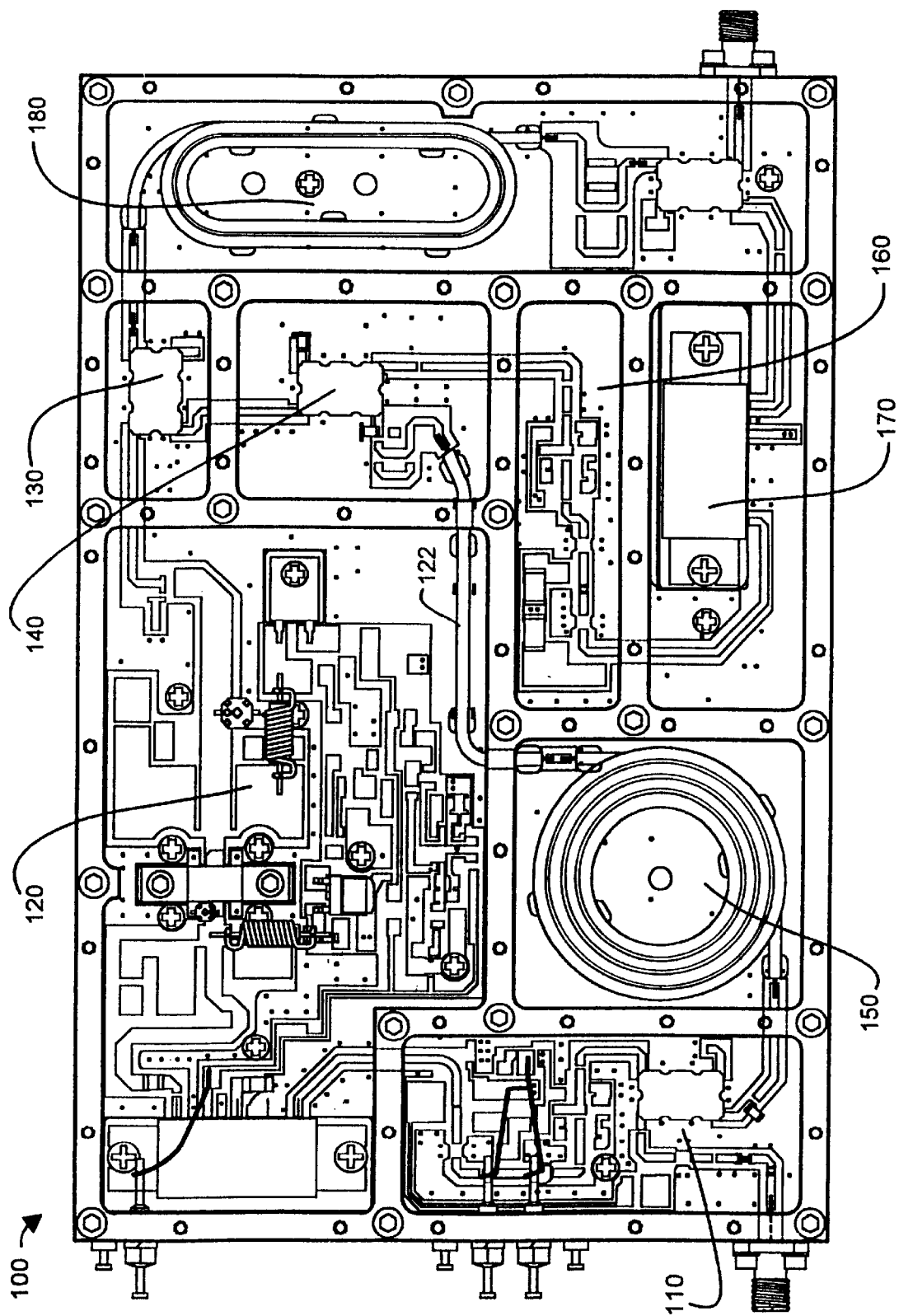
FIG. 2 is a top plan view of the module with the top cover removed, showing the interior compartments formed by the machined enclosure mounted to the circuit board and heat sink.

FIG. 2 is a top plan view of the module of the present invention, further illustrating how the feed-forward amplifier subsystem is partitioned into separately shielded compartments or cavities. The general layout of the compartments in FIG. 2 corresponds to the layout of the compartments illustrated in FIG. 1, but FIG. 2 more clearly shows the physical implementation of the module (only the major circuit components are shown; for clarity, the smaller surface-mount components are not illustrated).

As seen in FIG. 2, compartment 110 is the main amplifier driver stage and compartment 120 is the main amplifier final stage. The signal is then split by splitter S1, with part of the signal being applied to the first loop delay line D1 in compartment 150, and part of the signal passing though gain and phase compensation components A and Φ before being amplified by driver A2.

The amplified main signal L passes from compartment 120 into compartment 130, where 30 dB coupler S2 splits the signal into a main output signal, which is applied to the second loop delay line D2 in compartment 180, and a lower level sample which is applied to the first loop cancellation combiner C1 in compartment 140. The first loop cancellation combiner subtractively combines the delayed signal from the first loop delay line D1 with sample from coupler S2, producing a signal primarily comprising the error components generated by amplifier A3. Since compartment 150 does not share a compartment boundary with compartment 140, the signal from delay line D1 is routed through a section of semi-rigid RF cable, 122, which is attached to the printed circuit board and passes through compartment 120.

Compartment 160 is the error amplifier driver stage, and compartment 170 is the error amplifier final stage. Compartment 180 contains the second loop delay line D2 and second loop cancellation combiner C2, where the errors introduced by amplifier A3 are effectively cancelled by the amplified error signal.

Since the gain and phase characteristics of circuit elements may drift, practical feed-forward amplifiers commonly employ some type of active compensation to preserve optimal circuit function. Drift may result from temperature changes, normal component changes over time, or, in the case of the main amplifier output, from changes in the load which the amplifier is driving. A number of techniques for compensating for such drift are well known in the art, including negative feedback circuits for compensating and stabilizing the main amplifier path; methods using a test signal injected into the main amplifier input path and sensed at the amplifier output to derive control signals to control the amplitude and phase of the error amplifier operation (see U.S. Pat. Nos. 5,323,119 and 5,508,657); and methods involving the characterizing of circuit performance over temperature, storing compensation values in a look-up table, and employing a microcontroller system to control gain and phase compensation components in the various signal paths.

In the error amplifier module of the present invention, the preferred implementation of the invention utilizes simple temperature compensation techniques to adjust for component drift. Since the preferred embodiment utilizes class A amplifiers for both the "main" amplifier and "error", and such amplifiers are known to have the general characteristics of linear phase and amplitude drift with temperature, more complex compensation techniques are unnecessary. Also, since the error amplifier module is intended to be embedded within an overall amplifier system, the load on the error amplifier module can be controlled and the need to compensate for different load characteristics is avoided. The error amplifier module is also sufficiently compact that it may be a single module mounted on a common heat sink, effectively resulting in the temperatures of the various components tracking in temperature.

PREFERRED EMBODIMENT OF THE FEEDFORWARD AMPLIFIER MODULE

(FIG. 3)

FIG. 3 is an exploded view of one corner of the feedforward amplifier module of the present invention, illustrating the novel features of its construction. The view in FIG. 3 corresponds to the upper left of the module as viewed in FIGS. 1 and 2. The module comprises a heatsink 20, printed circuit board 40, machined enclosure 60, and flat cover 80. The printed circuit board 40 is sandwiched between the heatsink 20 and the machined enclosure 60, with a plurality of screws 78 firmly retaining the enclosure and printed circuit board to the heatsink.

Heatsink 20 has a substantially flat upper surface 22 and cooling fins 24 formed on the bottom. The heatsink is typically made of extruded aluminum. The upper surface 22 includes a plurality of tapped holes 26 for receiving mounting screws for the attachment of the printed circuit board and machined enclosure. The upper surface 22 of the heatsink may have machined recesses 28 permitting circuit traces (not shown) to be run on the lower side of the printed circuit board.

Enclosure frame 60 is typically fabricated from 0.375" thick aluminum stock, with is machined to form the separate internal cavities. The machining results in an enclosure having an outer wall 62, and a plurality of internal cavities formed by inner walls 64. Where it is necessary for the RF signal to pass from one cavity to another, channels 72 and 74 are machined into the lower sides of the cavity walls; the locations of these channels correspond to traces on the circuit board or to semi-rigid cable, as discussed below. Enclosure 60 further has a plurality of drilled through holes 66 for the mounting of DC power feedthroughs and RF connectors (not shown). The enclosure also has numerous holes 68 for recessed screws 78 for firmly retaining the enclosure, circuit board, and heatsink together; and tapped holes 70 for attaching cover 80 to the enclosure with screws 88, as discussed below.

Printed circuit board 40 comprises a flat sheet of insulative material with conductive ground planes and circuit traces formed on the upper and lower surfaces, as is well known in the art. A portion of the upper surface ground plane is illustrated in FIG. 3 (callout 44). As will be further explained below, a significant feature of the ground planes on both the upper and lower surfaces (the lower surface is not illustrated) is that they substantially cover the areas directly beneath both the outer walls 62 and inner divider walls 64 of enclosure 60, except for where circuit traces connect one compartment to another, as exemplified by circuit trace 48. Within the ground planes directly beneath the enclosure walls are numerous plated-through holes 50, which serve to electrically connect the upper and lower ground planes and which also serve a mechanical function, as explained below.

Where the RF signal passes from one cavity to an adjacent cavity, the ground plane 44 is discontinuous and a signal trace such as depicted at callout 48 is run between the two cavities; a channel 72 in the cavity wall is positioned directly above the signal trace. Where the RF signal must pass from one cavity to a non-adjacent cavity through a third cavity, as from compartment 150 to compartment 140 in FIG. 2, a piece of semi-rigid cable 90 is mounted on the circuit board, to isolate the signal from the third cavity. Channels 74 are formed in the cavity walls directly above the semi-rigid cable.

View A—A of FIG. 3 shows a cross-section through one of the plated-through holes 50. The inner core 42 of the circuit board is an insulative material; teflon is a preferred material for radio-frequency applications because of its low-loss dielectric characteristics. One mechanical characteristic of teflon is its tendency to flow or deform over time when under mechanical stress. Teflon therefore cannot be relied upon for structurally insuring that the ground planes on the upper and lower sides of the circuit board remain in good electrical contact with the machined enclosure and heatsink. A conductive material, typically copper, is plated onto the upper and lower surfaces 44 and 46 of the circuit board, and also, importantly, onto the inner surfaces 52 of the plated-through holes. Although view A—A depicts the hole as open from top to bottom, during the manufacturing process the holes may be partially or fully filled with solder without impairing their function.

As discussed above, the preferred embodiment of the module is intended to operate over the carrier frequency range of approximately 850–900 MHz. The wavelength at these frequencies is known to be approximately 13 inches in air and 9.3 inches in teflon. As shown in FIG. 3, the numerous plated through holes 50 are spaced beneath the enclosure walls with a typical spacing between the holes of less than $\frac{1}{10}$ of the carrier signal wavelength in teflon, or roughly 0.9 inches. It is further known that a conductive grid with a spacing of $\frac{1}{10}$ wavelength will substantially eliminate propagation of an electromagnetic wave (a "rule of thumb" of $\frac{1}{8}$ wavelength is also common in the art). The plated-through holes 50 in electrical communication with the upper and lower ground planes 44 and 46 thus form a grid around each compartment of the module, effectively eliminating signal leakage between the compartments.

The plated-through holes also perform an important mechanical function. To insure that the separate compartments are fully shielded, it is necessary that the upper ground plane 44 remains in good electrical contact (with a maximum gap of $\frac{1}{10}$ wavelength) with the enclosure walls, and that the lower ground plane 46 remains in electrical contact (with a maximum gap of $\frac{1}{10}$ wavelength) with the aluminum heatsink. The teflon core material of the printed circuit board cannot be relied upon to mechanically maintain this contact, since it will flow or sag over time. The plating material on the inner surfaces 52 of the plated-through holes 50 thus provides the mechanical rigidity to insure that no gap greater than $\frac{1}{10}$ wavelength develops in the compartment shielding. The plating material can sustain the mechanical force between the enclosure walls above the circuit board and the heatsink below the circuit board without significantly deforming over time.

It may also be observed that the plated-through holes 50 are staggered from side-toside along the length of the enclosure walls, rather than placed in straight lines. This staggering further serves to better distribute the mechanical forces on the circuit board and to ensure electrical contact between the enclosure walls, circuit board, and heatsink.

The edges 54 of circuit board 40 may also be plated with a conductive material, forming a contiguous ground plane with the upper and lower ground planes 44 and 46. This serves to further reduce RF leakage from the module to the outside environment.

In manufacturing the module, the circuit board is first constructed and the surface-mount components are attached by a re-flow soldering process. Other components, such as the delay lines and semi-rigid cables, are attached to the circuit board by hand assembly. The circuit board 40 is then placed on the heatsink 20, and enclosure 60 is placed on the circuit board. Recessed screws are then placed into enclosure holes 68, through circuit board holes 58, and into tapped heatsink holes 26, and tightened to firmly attach enclosure, circuit board, and heatsink.

To complete the module assembly, cover 80 may then be attached to the enclosure using screws 88, which engage tapped holes 70. Cover 80 is typically formed of an aluminum sheet with numerous mounting holes 82 drilled through it. For testing of the module, a temporary cover having access holes above test points and adjustment points may be used (not shown). As with the plated-through holes on the circuit board, tapped holes 70 are spaced such that the adjacent holes are no more than $1/10$ wavelength apart so as to prevent electromagnetic leakage. With holes 70 the wavelength of interest in the wavelength of the RF signal in air, which is approximately 1.3 inches.

TEMPERATURE COMPENSATION

FIGS. 4(a) and 4(b)

A significant advantage of having both the "main" amplifier and the "error" amplifier of the module mounted on a common circuit board which is maintained in firm contact with a common heatsink is that the two amplifiers will track in temperature, and thus a single temperature sensor may be utilized to provide gain and phase compensation control signals for both. FIGS. 4(a) and 4(b) illustrate the cancellation achieved in the first and second cancellation loops of the feed-forward amplifier.

FIG. 4(a) shows the first loop cancellation as measured at point "M" in FIG. 1. A 869–894 MHz swept signal was injected into input "K" of the module and the midband marker (881.5 MHz) was monitored at point "M" as the module temperature was varied, both with the temperature sensor output connected to the gain and phase compensation circuits in compartment 110 (triangles) and with the compensation signals set to their 25° C. values (squares).

FIG. 4(b) shows the second loop cancellation as measured at the output of the module (point "tR" in FIG. 1. Again, a 869–894 MHz swept signal was injected at point "L" of the module and the midband marker (881.5 MHz) was monitored at the module output as the module temperature was varied, both with the temperature sensor output connected to the gain and phase compensation circuits in compartment 160 (triangles) and with the compensation signals set to their 25° C. values (squares).

CONCLUSION

The above is a detailed description of particular embodiments of the invention. It is recognized that departures from the disclosed embodiments may be within the scope of this invention and that obvious modifications will occur to a person skilled in the art. It is the intent of the applicant that the invention include alternative implementations known in the art that perform the same functions as those disclosed. This specification should not be construed to unduly narrow the full scope of protection to which the invention is entitled.

The corresponding structures, materials, acts, and equivalents of all means or step plus function elements in the claims below are intended to include any structure, material, or acts for performing the functions in combination with other claimed elements as specifically claimed.

What is claimed is:

1. A manufacturing module for a radio-frequency feed-forward amplifier electronic subsystem, comprising:

a) a substantially flat enclosure frame formed of an electrically conductive material and having a top surface, a bottom surface, and a perimeter; the enclosure frame having a thickness greater than the heights of the electronic components forming the subsystem; the enclosure frame further having a plurality of cavities through its thickness extending from the top surface to the bottom surface, the cavities formed such that walls of electrically conductive material surround each cavity and an outer wall extends around the frame perimeter;

b) a substantially flat printed circuit board having an upper surface, a lower surface, and an inner core formed of a dielectric material;

c) a heatsink formed of an electrically conductive material, the heatsink having a substantially flat upper surface;

the bottom surface of the enclosure frame being firmly retained to and in electrical communication with the upper surface of the printed circuit board and the lower surface of the printed circuit board being firmly retained to and in electrical communication with the upper flat surface of the heatsink;

the printed circuit board further having a substantially continuous ground plane on its upper surface where it contacts the bottom surface of the enclosure and a corresponding substantially continuous ground plane on its lower surface, the ground planes including numerous plated-through holes electrically connecting the upper and lower surfaces;

the feed-forward amplifier having a first cancellation loop and a second cancellation loop, the first and second cancellation loops having gain and phase compensation signals, the gain and phase cancellation signals of the first and second cancellation loops being generated by a single temperature sensor in thermal contact with the heat sink.

2. The manufacturing module for a radio-frequency electronic subsystem of claim 1, wherein the numerous plated-through holes of the circuit board are spaced apart no more than $1/8$ wavelength in the dielectric material of the highest operating frequency of the module.

3. The manufacturing module for a radio-frequency electronic subsystem of claim 1, wherein the flat enclosure is aluminum and the plurality of cavities are formed by machining.

4. The manufacturing module for a radio-frequency electronic subsystem of claim 1, wherein the circuit board further has a a perimeter edge, the perimeter edge having a plated ground plane in electrical communication with the ground planes on the upper and lower surfaces.

5. The manufacturing module for a radio-frequency electronic subsystem of claim 1 further comprising a substantially flat cover formed of an electrically-conductive material firmly retained to the top surface of the flat enclosure and in electrical contact with the enclosure.

6. The manufacturing module for a radio-frequency electronic subsystem of claim 5 wherein the cover has numerous screw holes in its flat surface, the holes positioned over the walls of the enclosure; the enclosure further having corresponding tapped screw holes, and the cover being retained to the enclosure with screws.

7. The manufacturing module for a radio-frequency electronic subsystem of claim 6, wherein the numerous screw holes in the cover and the corresponding tapped screw holes in the cover are spaced apart no more than $\frac{1}{8}$ wavelength in air of the highest operating frequency of the module.

* * * * *